(12) United States Patent
Chun et al.

(10) Patent No.: US 11,688,658 B2
(45) Date of Patent: Jun. 27, 2023

(54) SEMICONDUCTOR DEVICE

(71) Applicant: Micron Technology, Inc., Boise, ID (US)

(72) Inventors: Hyunsuk Chun, Boise, ID (US); Shams U. Arifeen, Boise, ID (US); Chan H. Yoo, Boise, ID (US); Tracy N. Tennant, Eagle, ID (US)

(73) Assignee: Micron Technology, Inc., Boise, ID (US)

( * ) Notice: Subject to any disclaimer, the term of this patent is extended or adjusted under 35 U.S.C. 154(b) by 178 days.

(21) Appl. No.: 17/202,542

(22) Filed: Mar. 16, 2021

(65) Prior Publication Data

US 2021/0202337 A1 Jul. 1, 2021

Related U.S. Application Data

(62) Division of application No. 15/683,059, filed on Aug. 22, 2017, now abandoned.

(51) Int. Cl.
| | |
|---|---|
| *H01L 21/48* | (2006.01) |
| *H01L 23/31* | (2006.01) |
| *H01L 23/498* | (2006.01) |
| *H01L 21/683* | (2006.01) |
| *H01L 21/56* | (2006.01) |

(52) U.S. Cl.
CPC ...... *H01L 23/3128* (2013.01); *H01L 21/4853* (2013.01); *H01L 21/4857* (2013.01); *H01L 21/565* (2013.01); *H01L 21/568* (2013.01); *H01L 21/6835* (2013.01); *H01L 23/49816* (2013.01); *H01L 23/49838* (2013.01); *H01L 23/3114* (2013.01); *H01L 23/3135* (2013.01); *H01L 2221/68345* (2013.01); *H01L 2221/68359* (2013.01); *H01L 2224/16225* (2013.01);

(Continued)

(58) Field of Classification Search
CPC . H01L 21/565; H01L 21/568; H01L 21/6835; H01L 21/4857; H01L 21/4853; H01L 2221/68359; H01L 2221/68345; H01L 2924/15311; H01L 2924/18; H01L 2924/16225
See application file for complete search history.

(56) References Cited

U.S. PATENT DOCUMENTS

| | | |
|---|---|---|
| 6,011,314 A | 1/2000 | Leibovitz et al. |
| 6,756,671 B2 | 6/2004 | Lee et al. |

(Continued)

FOREIGN PATENT DOCUMENTS

CN 106571344 A 4/2017

OTHER PUBLICATIONS

International Search Report and Written Opinion from related international application No. PCT/US2018/047126, dated Dec. 20, 2018, 14 pp.

(Continued)

*Primary Examiner* — Hoa B Trinh
(74) *Attorney, Agent, or Firm* — Brooks, Cameron & Huebsch, PLLC (57) ABSTRACT

A semiconductor device having a semiconductor die, a redistribution layer (RDL), and an encapsulant. The RDL layer can be formed on a first surface of the semiconductor die. The encapsulant can enclose a second surface and side surfaces of the semiconductor die. The encapsulant can enclose side portions of the RDL.

20 Claims, 6 Drawing Sheets

(52) U.S. Cl.
CPC . *H01L 2224/18* (2013.01); *H01L 2924/15311* (2013.01); *H01L 2924/181* (2013.01)

(56) References Cited

U.S. PATENT DOCUMENTS

| | | | |
|---|---|---|---|
| 7,646,087 B2 | 1/2010 | Tu et al. | |
| 8,629,546 B1 | 1/2014 | Scanlan | |
| 8,772,058 B2 | 7/2014 | Reed et al. | |
| 8,937,381 B1 | 1/2015 | Dunlap | |
| 9,570,369 B1 | 2/2017 | Shih et al. | |
| 2013/0069239 A1 | 3/2013 | Kim | |
| 2013/0234322 A1* | 9/2013 | Pendse | H01L 25/0657 257/737 |
| 2014/0091471 A1* | 4/2014 | Chen | H01L 21/6836 257/770 |
| 2014/0217610 A1 | 8/2014 | Jeng | |
| 2015/0179591 A1 | 6/2015 | Tsai et al. | |
| 2015/0262909 A1 | 9/2015 | Chen | |
| 2016/0284620 A1 | 9/2016 | Hu | |
| 2016/0300813 A1 | 10/2016 | Zhai et al. | |
| 2016/0315071 A1 | 10/2016 | Zhai et al. | |
| 2016/0358889 A1* | 12/2016 | Lai | H01L 21/768 |
| 2017/0103943 A1 | 4/2017 | Hu | |
| 2017/0338202 A1 | 11/2017 | Tsai | |
| 2018/0190581 A1 | 7/2018 | Lin | |
| 2018/0323170 A1* | 11/2018 | Kim | H01L 23/3128 |

OTHER PUBLICATIONS

Office Action from related Taiwanese patent application No. 107129211, dated Mar. 22, 2019, 15 pp.

Office Action from related Taiwanese patent application No. 107129211, dated Sep. 19, 2019, 14 pages.

\* cited by examiner

SEMICONDUCTOR DEVICE

PRIORITY INFORMATION

This application is a Divisional of U.S. application Ser. No. 15/683,059, filed on Aug. 22, 2017, the contents of which are incorporated herein by reference in its entirety.

TECHNICAL FIELD

The present disclosure relates generally to semiconductor devices and methods.

BACKGROUND

An integrated circuit (IC) can be a set of electronic circuits on one small flat piece ("chip") of semiconductor material (e.g., silicon). The IC can include a large number of tiny transistors integrated into a small chip resulting in circuits that can be smaller and faster than those constructed of discrete electronic components. The IC can be packaged at a wafer level, in contrast to a process of assembling individual units in packages after dicing them from a wafer. In its final form, the IC can be a die with an array pattern of bumps or solder balls attached at an input/output (I/O) pitch that is compatible with circuit board assembly processes.

A semiconductor die assembly may include a plurality of memory die, and the substrate associated with the plurality of memory die may be an organic or inorganic substrate. Semiconductor die assemblies can be used in a variety of electronic applications, such as personal computers, cell phones, digital cameras, and other semiconductor devices. The semiconductor device can include at least one semiconductor die coupled to a substrate through a plurality of conductive structures (e.g., metals, wires, conductive lines, solderbumps, etc.). The plurality of conductive structures can be within a redistribution layer that helps connect the semiconductor die to the substrate. The redistribution layer can be exposed to conditions from the outside of the semiconductor device which can lead to interfacial delamination, crack-induced mechanical stress, moisture impact, among other issues, during an assembly process and/or during use. The semiconductor die can include functional features, such as memory cells, processor circuits, imager components, and interconnecting circuitry.

DETAILED DESCRIPTION

A semiconductor device can include a semiconductor die, a redistribution layer (RDL), and an encapsulant. The RDL layer can be formed on and enclosing a first surface of the semiconductor die. The encapsulant can enclose a second surface and side surfaces of the semiconductor die. The encapsulant can enclose side portions of the RDL.

A process for forming a semiconductor device can result in a die attached to a redistribution layer (RDL). In at least one embodiment, the RDL can be a built-up layer that can be fabricated either directly on a semiconductor die or built on a carrier. The RDL can then be transferred to the die rather than using a pre-formed substrate. The die can be encased in an encapsulant (e.g., an organic material layer, an epoxy mold compound (EMC), etc.) that surrounds the die. A number of interconnect structures (e.g., an interconnect structure, a copper pillar bump, a gold bump, etc.) and/or additional connective components can be coupled to the RDL and utilized to electrically connect the semiconductor device to a number of other semiconductor devices and/or other components of a semiconductor device. The interconnect structures can be used to connect a circuit on a die to a pin on a packaged chip. The interconnect structure can be an electroplated structure. For example, a coating can be formed using an electrolytic deposition with copper, nickel, tin-silver, silver, old, or another metal, including alloys of the listed metals, to form an interconnect structure and/or a pillar bump.

In some previous approaches, an edge of the RDL can be exposed (e.g., not encased within the encapsulant) to conditions from the outside of the semiconductor device which can lead to interfacial delamination, crack-induced mechanical stress, and moisture impact, among other issues, during an assembly process and/or during use. As described further below, in at least one embodiment, the edge of the RDL can be encased within an encapsulant (e.g., an organic material layer, an EMC) layer. By encasing the edge of the RDL layer within the encapsulant (e.g., an organic material layer, an EMC layer), the RDL can be protected from various adverse conditions during the forming process and/or during use.

In at least one embodiment, encapsulants can be formed between a number of interconnect structures (e.g., solderballs) coupled to the RDL layer. For example, an encapsulant between a first interconnect structure and a second interconnect structure can be formed along at least a portion of the interconnect structure of each of the first interconnect structure and the second interconnect structure and in the space between them along the RDL. The encapsulant between the interconnect structures can protect a joint of the interconnect structure from failure (e.g., during testing of the semiconductor device).

In some previous approaches, during a fan-out wafer-level packaging process (FOWLP), an interconnect structure (e.g., a solder ball) attached to the RDL can be coupled directly to the printed circuit board (PCB). This can cause thermo-mechanical stress generated during a board level test. Due to a stiffness difference between the package and the PCB, a joint failure can occur during a drop test, and a solder joint failure can occur due to a coefficient of thermal expansion (CTE) difference between the package and the PCB. In at least one embodiment described below, by filling the space between the interconnect structures with the encapsulant, the affect of the CTE difference can be minimized and reduce the thermos-mechanical stress.

A semiconductor device can include a number of articles of manufacture, including, for example, integrated circuit (IC) dies, imager dies, sensor dies, and/or dies having other semiconductor features. While a number of examples of semiconductor devices are illustrated in FIGS. 1A-4H, examples are not so limited. Components and/or semiconductor features can be altered and/or modified in a number of ways.

In the following detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure.

The figures herein follow a numbering convention in which the first digit or digits correspond to the drawing figure number and the remaining digits identify an element or component in the drawing. Similar elements or components between different figures may be identified by the use of similar digits. For example, 114 may reference element "14" in FIG. 1A, and a similar element may be referenced as 214 in FIG. 2A. Also, as used herein, "a number of" a particular element and/or feature can refer to one or more of such elements and/or features.

Figure 1A:
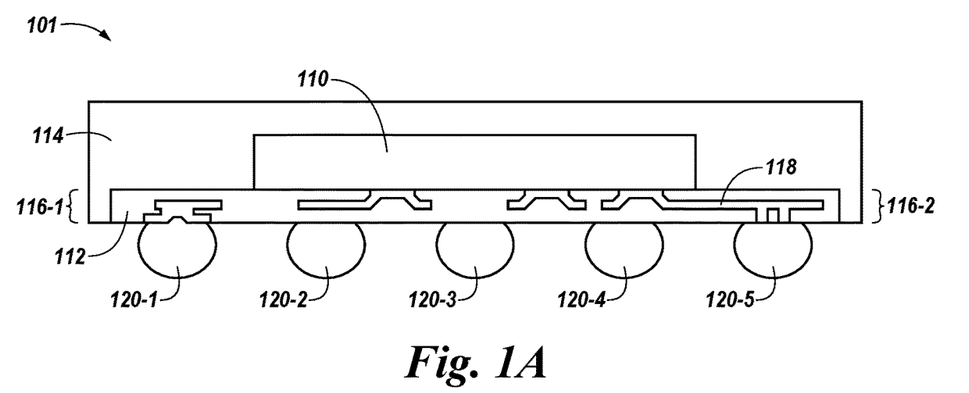
FIG. 1A is an example of a semiconductor device in accordance with a number of embodiments of the present disclosure.

FIG. 1A is an example of a semiconductor device 101 in accordance with a number of embodiments of the present disclosure. Semiconductor device 101 can include a memory chip 110. The memory chip 110 can be, for example, an integrated circuit including a set of electronic circuits on a single, flat piece of semiconductor material. The semiconductor material can be silicon, glass, or other materials.

The semiconductor device 101 can include a redistribution layer 112 that is a dielectric. A redistribution layer (RDL) 112 refers to an extra metal layer on the memory chip 110 that makes input/output contacts with additional semiconductor devices (such as an integrated circuitry in additional locations). The RDL 112 can be an extra layer of wiring on the memory chip 110 that enables the memory chip 110 to bond out from different locations on the memory chip 110, making chip-to-chip bonding easier. Wiring 118 of the RDL 112 can be electrically coupled to an additional electrical contact (such as interconnect structure 120-5, as illustrated).

The semiconductor device 101 can include an encapsulant (e.g., an organic material layer, an epoxy mold compound (EMC)) 114 that encases (e.g., surrounds, covers, etc.) the memory chip 110. A first side portion 116-1 of the encapsulant 114 can encase a first edge of the RDL 112 and a second side portion 116-2 of the encapsulant 114 can encase a second edge of the RDL 112. The encapsulant 114 can be used to encapsulate portions of semiconductor device 101 due to properties of the encapsulant 114 that includes high mechanical strength and high productivity. The encapsulant 114 are solid epoxy polymers that are heated to a liquid and can then be injected over a circuit for protection of the circuit. By covering the RDL 112 with the first side portion 116-1 and the second side portion 116-2, the edge of the RDL 112 is protected by these properties and can avoid interfacial delamination, cracking induced by moisture, and decrease effects of thermo-mechanical stress on the edge of the RDL 112. The encapsulant 114 encasing the edge of the RDL 112 prevents moisture absorption through a sidewall of the RDL 112.

The memory hip 110 can be electrically coupled to a number of interconnect structures (such as solderballs) through the RDL 112. As illustrated, the memory chip 110 is electrically coupled to interconnect structures 120-1, 120-2, 120-3, 120-4, 120-5, as is illustrated by wiring 118 electrically coupling the memory chip 110 to interconnect structures 120-5.

Figure 1B:
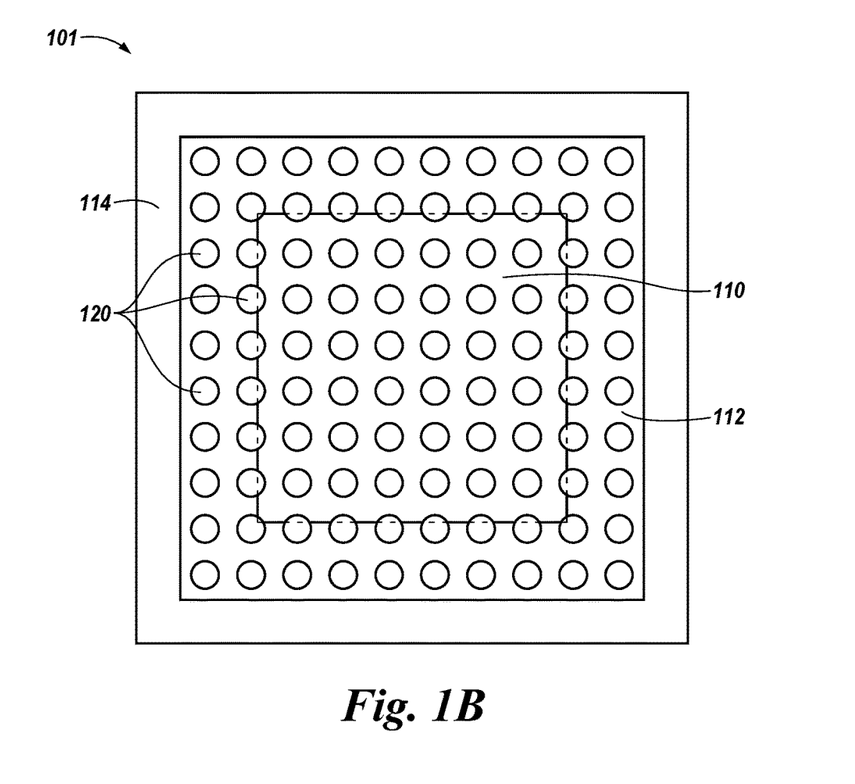
FIG. 1B is an example of a portion of a semiconductor device in accordance with a number of embodiments of the present disclosure.

FIG. 1B is an example of a portion of a semiconductor device 101 in accordance with a number of embodiments of the present disclosure. FIG. 1B is an example of a bottom view of a memory chip, such as memory chip 110 illustrated in FIG. 1A. While five (5) interconnect structures (e.g., solderballs) are illustrated in FIG. 1A, shown as interconnect structures 120-1 through 120-5, a greater number of interconnect structures are illustrated in FIG. 1B, a first of which is labeled as interconnect structures 120 for ease of illustration. The semiconductor device 101 includes a redistribution layer 112 and an encapsulant (e.g., EMC) 114. As illustrated from a bottom view in FIG. 1B, the encapsulant 114 extends beyond an edge of the RDL 112 to provide protection to the edge of the RDL 112.

Figure 2A:
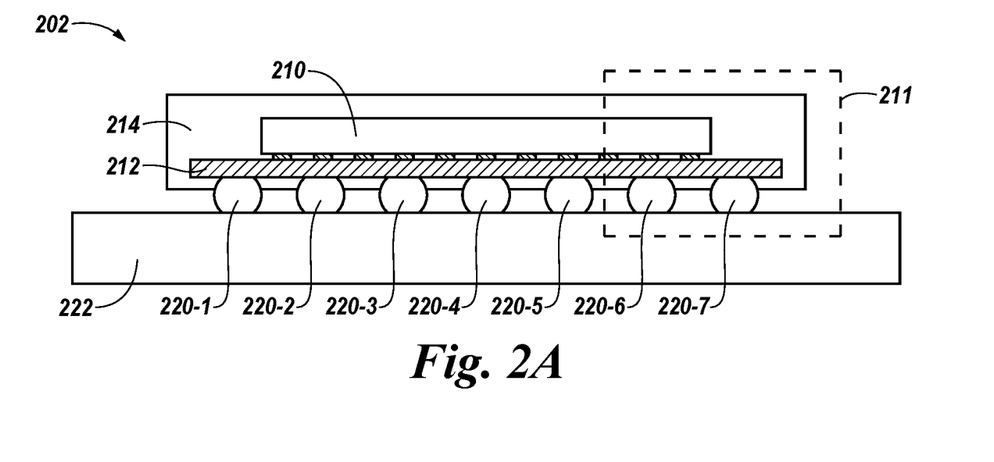
FIG. 2A is an example of a semiconductor device in accordance with a number of embodiments of the present disclosure.

FIG. 2A is an example of a semiconductor device 202 in accordance with a number of embodiments of the present disclosure. The semiconductor device 202 includes a semiconductor die 210 and a redistribution layer (RDL) 212 that are enclosed by an encapsulant (e.g., an organic material layer, an epoxy mold compound (EMC)) 214. A redistribution layer (RDL) 212 refers to an extra metal layer on the memory chip 210 that makes input/output contacts with additional semiconductor devices (such as an integrated circuitry in additional locations). The RDL 212 can be an extra layer of wiring on the memory chip 210 that enables the memory chip 210 to bond out from different locations on the memory chip 210, making chip-to-chip bonding easier. The RDL 114 can be coupled to a number of interconnect structures (e.g., solderballs) 210-1, 210-2, 210-3, 210-4, 210-5, 210-6, 210-7 (referred to herein as interconnect structures 210) that coupled the semiconductor die 210 to a printed circuit board (PCB) 222 through the RDL 214 and the interconnect structures 220.

The encapsulant 214 encloses the semiconductor die 210, the RDL 212 and in between the interconnect structures 220. In this way, the two edges of the RDL 212 are enclosed to protect the RDL 212 from thermos-mechanical stress and interfacial delamination/cracking induced by moisture. The portions between the interconnect structures 220 on the underside of the RDL 212 is enclosed by the encapsulant 214 and protects a side of the RDL 212 facing the PCB 222 and covers the solder joint which improves the board level reliability (BLR) statistics. The encapsulant 214 encloses the side of the RDL 212 facing the PCB 222 instead of an underfill (UF) material. Warpage of the RDL 212 is decreased due to the encapsulant 214 covering the side of the RDL 212 facing the PCB 222. A portion 211 of the semiconductor device 202 is expanded in FIG. 2B for illustrative purposes.

Figure 2B:
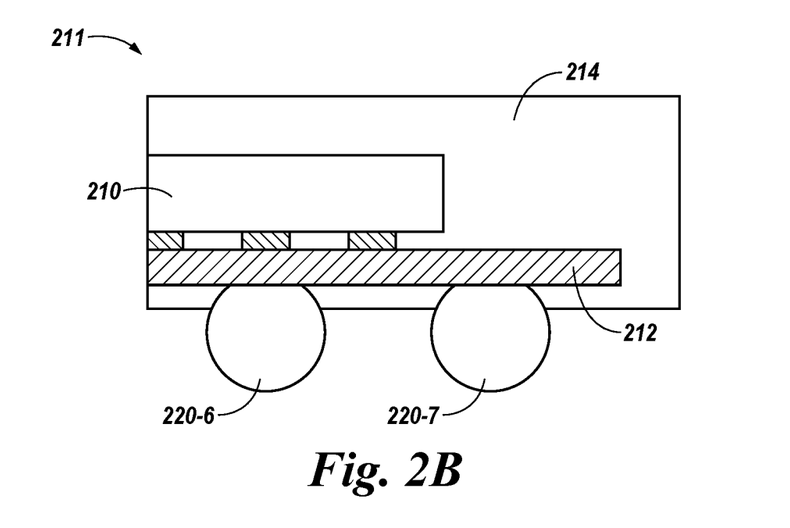
FIG. 2B is an example of a portion of a semiconductor device in accordance with a number of embodiments of the present disclosure.

FIG. 2B is an example of a portion 211 of a semiconductor device in accordance with a number of embodiments of the present disclosure. The portion 211 of the semiconductor device includes a semiconductor chip 210 enclosed by an encapsulant (e.g., an organic material layer, EMC) 214. The semiconductor chip 210 is coupled to a redistribution layer (RDL) 212 that is enclosed by an encapsulant 214 on its side. The encapsulant 214 wraps around the side of the RDL 212 and encloses an underside of the RDL 212 until the encapsulant 214 meets up with an interconnect structure 220-7. The encapsulant 214 is between interconnect structures 220-6 and 220-7 on an underside of the RDL 212. In this way, the encapsulant 214 protects the side and underside of the RDL 212 and structurally supports the interconnect structures 220-6, 220-7 and holds them in place.

Figure 3A:
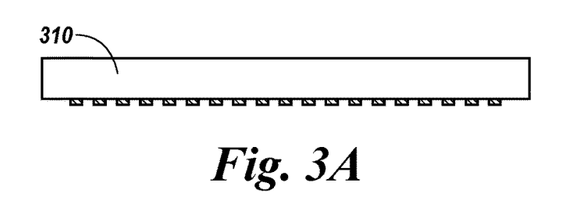
FIGS. 3A-3H are an example of a method of forming a semiconductor device in accordance with a number of embodiments of the present disclosure.
Figure 3B:
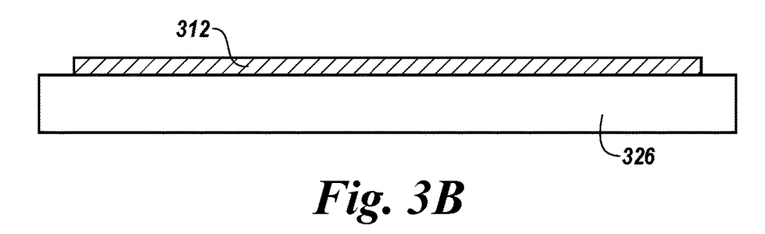

FIGS. 3A-3H are an example of a method of forming a semiconductor device in accordance with a number of embodiments of the present disclosure. FIG. 3A is an example of an initial step of the method of forming the semiconductor device which can include making a semiconductor die 210 for coupling to a redistribution layer later in the method. FIG. 3B is an example of a subsequent step that can include forming a redistribution layer 312 on a carrier substrate 326. The carrier substrate 326 can include a glass carrier, a silicon carrier, among other materials.

Figure 3C:
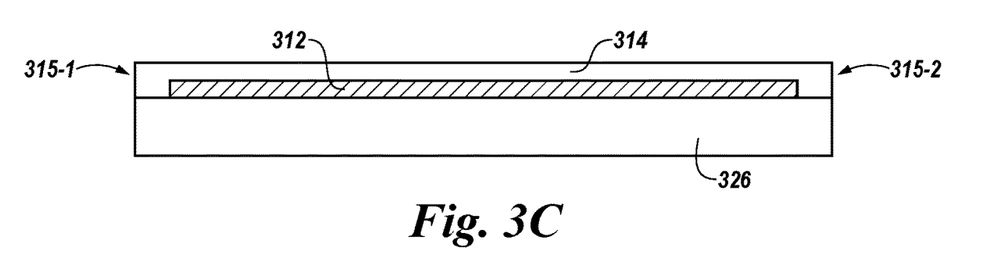

FIG. 3C is an example of a subsequent step of the method of forming the semiconductor device that can include forming an encapsulant (e.g., an organic material layer, an EMC layer) 314 over the RDL 312 such that the encapsulant 314 encloses a first side (illustrated as the top of the RDL 312) of the RDL 312 and side portions 315-1 and 315-2 of the RDL 314. As illustrated in FIG. 3C, the edge of the RDL 312 can be encased within the encapsulant 314. By encasing the edge of the RDL 312 within the encapsulant 314, the RDL 312 can be protected from interfacial delamination, crack-induced mechanical stress, and moisture impact. The interfacial delamination, crack-induced mechanical stress, and/or moisture impact can occur along the edges of the RDL 312 in the absence of the encapsulant 314 at the edges 315-1, 315-2 during an assembly process and/or during use.

Figure 3D:
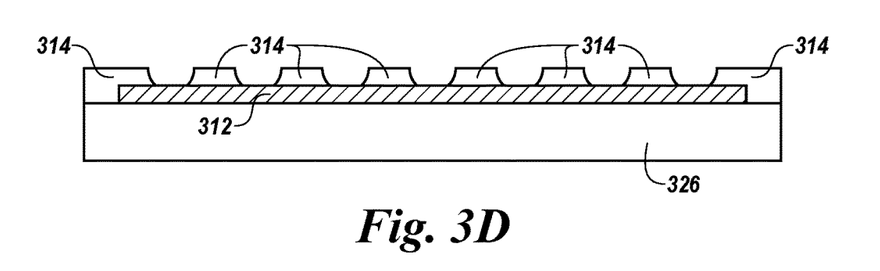
Figure 3E:
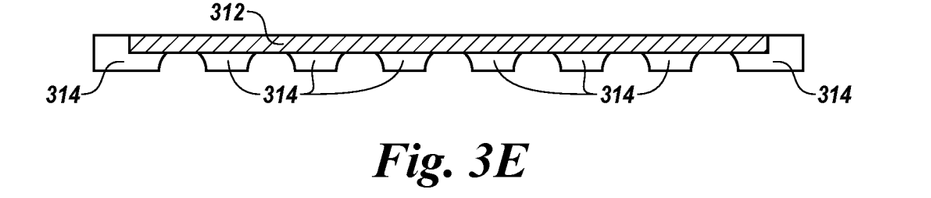

FIG. 3D is an example of a subsequent step of the method of forming the semiconductor device that can include removing portions of the encapsulant 314 from a side of the RDL 312. The removal of the portions can be performed by selective etching with a laser. The removal of the portions can create locations along the RDL 312 that can be used to insert additional semiconductor components, such as interconnect structures. The RDL 312, as illustrated, is attached to a carrier substrate 326. FIG. 3E is an example of a subsequent step of the method of forming the semiconductor device that can include removing a carrier substrate (such as carrier substrate 326 in FIG. 3D). FIG. 3E illustrates the RDL 312 and the encapsulant 314 rotated 180 degrees so that the removed portions of the encapsulant 314 are facing downward, as illustrated.

Figure 3F:
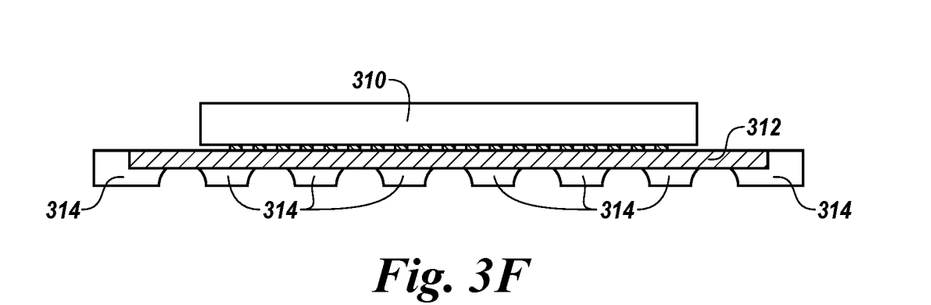

FIG. 3F is an example of a subsequent step of the method of forming the semiconductor device that can include coupling a semiconductor die 310 (such as semiconductor die 310 described in FIG. 3A) to an RDL 312. The semiconductor die 310 can be coupled to the RDL 312 on an opposite side of the RDL 312 than the removed portions of the encapsulant 314.

As illustrated in FIG. 3F (and also in FIGS. 3G-3H), the RDL 312 extends beyond the sides of the semiconductor die 310 which allows for the "fan-out" characteristic in a fan-out wafer-level packaging (FOWLP) process, as used in this example. The FOWLP allows for a greater number of external input/output (I/O) and system-in-package methods as the external I/Os have a larger surface of RDL 312 to attach to beyond the edges of the semiconductor die 310. The process of forming the semiconductor device can be performed using either chip-first or chip-last methods. A chip-first method includes a die being attached to a temporary or permanent material structure prior to making an RDL that will extend from the die to a BGA (ball grid array) interface. BGA is a type of surface-mount packaging (a chip carrier) used for integrated circuits. BGA packages can be used to permanently mount devices such as microprocessors. A BGA can provide more interconnection pins that can be put on a dual in-line or flat package. In this manner, the yield loss is associated with creating the RDL after the die is mounted, subjecting the die to potential loss.

In a chip-last process, the RDL is created first and then the die is mounted. In this chip-last process, the RDL structure can be either electrically tested or visually inspected for yield loss, thereby avoiding placing a good die on bad sites. For low I/O die, where RDL is minimal and yields are high, a chip-first process can be preferred. For a high value die (large I/O) (as in a fan-out layout, as illustrated) a chip-last process can be preferred.

Figure 3G:
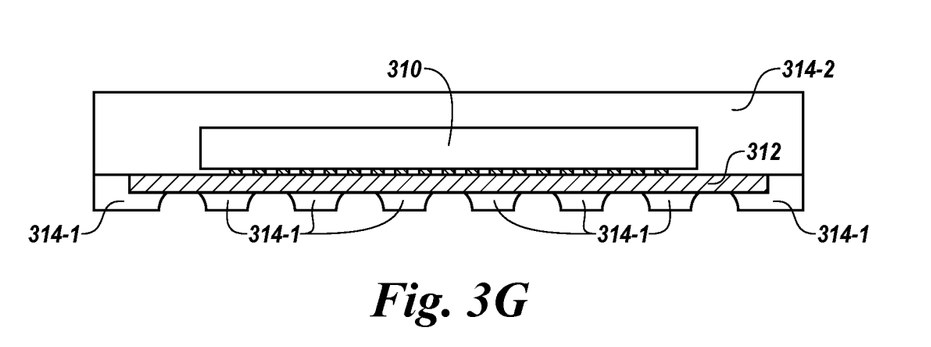

FIG. 3G is an example of a subsequent step of the method of forming the semiconductor device that can include forming an encapsulant (e.g., an EMC layer) 314-2 enclosing the semiconductor die 310 and connecting with the previously formed encapsulant 314-1. The encapsulant 314-2 can be a second portion of encapsulant that is formed subsequent to a first portion of encapsulant 314-1.

Figure 3H:
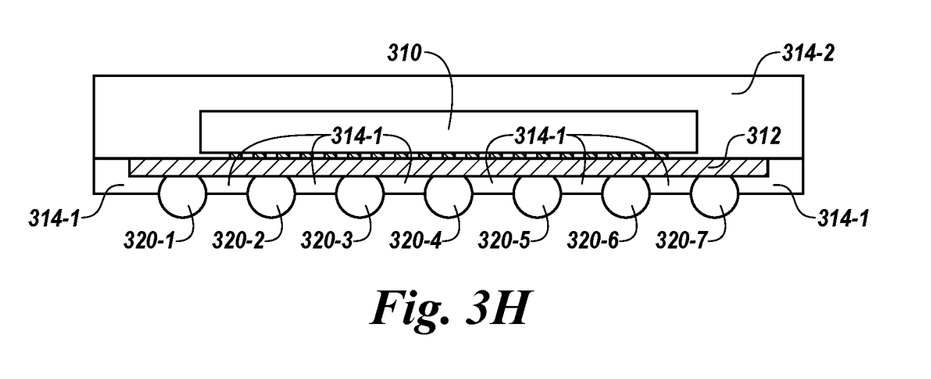

FIG. 3H is an example of a subsequent step of the method of forming the semiconductor device that can include attaching a number of interconnect stuctures 320-1, 320-2, 320-3, 320-4, 320-5, 320-6, 320-7, referred to herein as interconnect structures 320, to the RDL 312 at locations where the portions of the encapsulant 314-1 were removed. In this way, the interconnect structures 320 can be attached to the RDL 312 and portions of the encapsulant 314-1 such that the interconnect structures 320 are held into place by the encapsulant 314-1 to cause a stronger solder joint. The interconnect structures 320 can have stronger solder joints without adding underfill material to the interconnect structures 320 and the underside of the RDL 312.

Figure 4A:
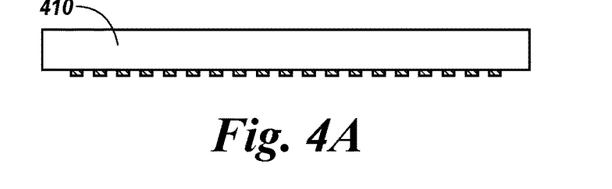
FIGS. 4A-4H are an example of a method of forming a semiconductor device in accordance with a number of embodiments of the present disclosure.
Figure 4B:
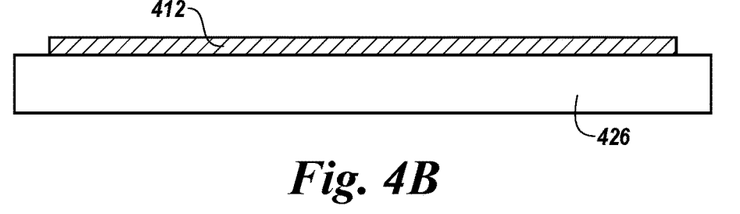
Figure 4C:
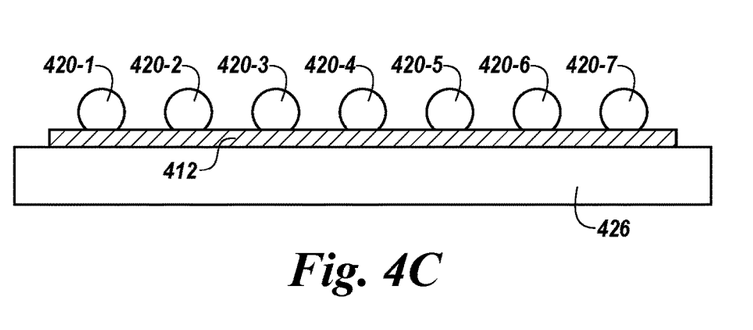

FIGS. 4A-4H are an example of a method of forming a semiconductor device in accordance with a number of embodiments of the present disclosure. FIG. 4A is an example of an initial step of the method of forming the semiconductor device which can include making a semiconductor die 410 for coupling to a redistribution layer later in the method. FIG. 4B is an example of a subsequent step of the method of forming the semiconductor device that can include forming a redistribution layer 412 on a carrier substrate 426. The carrier substrate 426 can include a glass carrier, a silicon carrier, among other materials. FIG. 4C is an example of a subsequent step of the method of forming the semiconductor device that can include attaching a number of interconnect structures (e.g., solderballs) 420-1, 420-2, 420-3, 420-4, 420-5, 420-6, 420-7, referred to herein as interconnect structures 420, to the RDL 412.

Figure 4D:
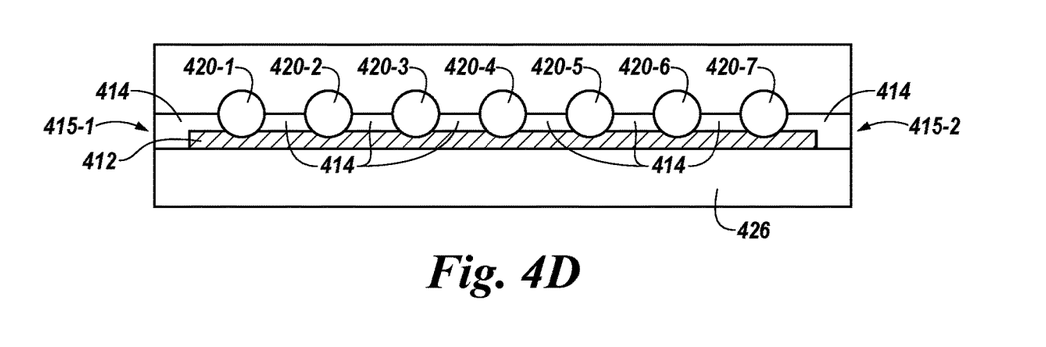

FIG. 4D is an example of a subsequent step of the method of forming the semiconductor device that can include using injection molding to form an encapsulant (e.g., an EMC layer) 414 between each of the interconnect structures 420 and at the ends 415-1, 415-2 of the RDL 412.

Figure 4E:
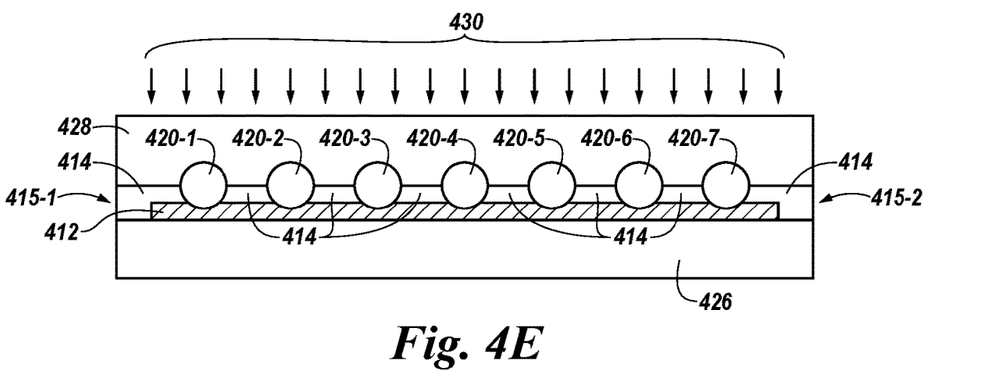

FIG. 4E is an example of a subsequent step, that is alternative to the subsequent step described in FIG. 4D, of the method of forming the semiconductor device. The alternative step can include using compression molding (illustrated as compression arrows 430), as opposed to injection molding as described in FIG. 4D, to form the EMC layer 414 between each of the interconnect structures 420 and at the ends 415-1, 415-2 of the RDL 412. Either of the steps illustrated in FIGS. 4D and 4E can be used to form the encapsulant 414, as illustrated. As illustrated in FIGS. 4D and 4E, the edge of the RDL 412 can be encased within the EMC layer 414. By encasing the edge of the RDL 412 within the encapsulant layer 414, the RDL 412 can be protected from interfacial delamination, crack-induced mechanical stress, and moisture impact. The interfacial delamination, crack-induced mechanical stress, and/or moisture impact can occur along the edges of the RDL 412 in the absence of (or when the RDL 412 edges are without) the encapsulant 414 at the edges 415-1, 415-2 during an assembly process and/or during use.

Figure 4F:
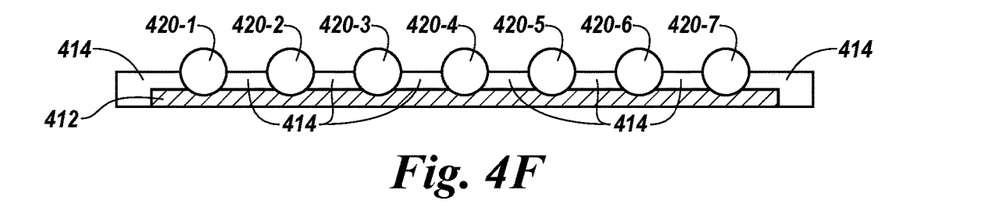
Figure 4G:
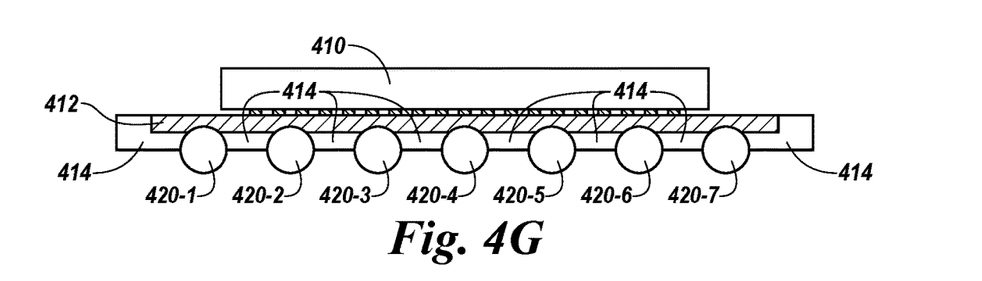

FIG. 4F is an example of a subsequent step of the method of forming the semiconductor device that can include removing a carrier substrate, such as carrier substrate 426 illustrated in FIGS. 4A-4E. FIG. 4G is an example of a subsequent step of the method of forming the semiconductor device. FIG. 4G illustrates the RDL 412, the encapsulant 414, and the interconnect structures 420 rotates 180 degrees. The step illustrated in FIG. 4G can include coupling a semiconductor die 410 (such as semiconductor die 410 described in FIG. 4A) to the RDL 412. The semiconductor die 410 can be coupled to the RDL 412 on an opposite side of the RDL 412 than the interconnect structures 420. As illustrated in FIG. 4G, the RDL 412 extends beyond the sides of the semiconductor chip 410 which allows for the "fan-out" characteristic in a fan-out wafer-level packaging (FOWLP) process, as used in this example. The FOWLP allows for a greater number of external input/output (I/O) and system-in-package methods, as described further above.

Figure 4H:
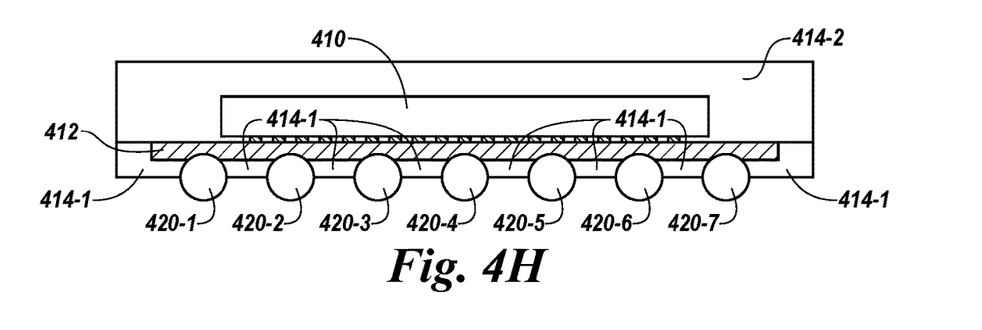

FIG. 4H is an example of a subsequent step of the method of forming the semiconductor device that can include forming an encapsulant 414-2 enclosing the semiconductor die 410 and connecting with the previously formed encapsulant 414-1. The encapsulant 414-2 can be a second portion of encapsulant that is formed subsequent to a first portion of encapsulant 414-1.

Although specific embodiments have been illustrated and described herein, those of ordinary skill in the art will appreciate that an arrangement calculated to achieve the same results can be substituted for the specific embodiments shown. This disclosure is intended to cover adaptations or variations of various embodiments of the present disclosure.

It is to be understood that the above description has been made in an illustrative fashion, and not a restrictive one. Combination of the above embodiments, and other embodiments not specifically described herein will be apparent to those of skill in the art upon reviewing the above description. The scope of the various embodiments of the present disclosure includes other applications in which the above structures and methods are used. Therefore, the scope of various embodiments of the present disclosure should be determined with reference to the appended claims, along with the full range of equivalents to which such claims are entitled.

In the foregoing Detailed Description, various features are grouped together in a single embodiment for the purpose of streamlining the disclosure. This method of disclosure is not to be interpreted as reflecting an intention that the disclosed embodiments of the present disclosure have to use more features than are expressly recited in each claim.

Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A method of forming a semiconductor device, comprising:
   forming a redistribution layer (RDL) on a carrier substrate;
   forming a first encapsulant on the RDL;
   removing a number of portions out of the first encapsulant;
   detaching the carrier substrate;
   attaching a semiconductor die to the RDL in place of the detached carrier substrate;
   forming a second encapsulant that encloses the semiconductor die and portions of the RDL facing toward but not in contact with the semiconductor die; and
   attaching a number of interconnect structures into each of the number of portions removed from the first encapsulant.

2. The method of claim 1, wherein forming the first encapsulant comprises forming the first encapsulant to enclose side portions of the RDL.

3. The method of claim 2, wherein the second encapsulant is formed to connect, at the side portions of the RDL, to the first encapsulant.

4. The method of claim 1, wherein the carrier substrate that the RDL is formed on comprises at least one of glass and silicon.

5. The method of claim 1, including removing the number of portions via laser etching.

6. The method of claim 1, including forming the semiconductor device without filling an area between the number of interconnect structures and a portion of the RDL facing away from the semiconductor die with underfill material.

7. A method for forming a semiconductor device, comprising:
   forming a redistribution layer (RDL) on a carrier substrate;
   attaching a number of interconnect structures onto a surface of the RDL opposite the carrier substrate;
   molding a first encapsulant onto the RDL between each of the number of interconnect structures;
   removing at least a portion of the first encapsulant to expose a portion of each of the number of interconnect structures;
   detaching the carrier substrate;
   attaching a semiconductor die to the RDL in place of the detached carrier substrate; and
   forming a second encapsulant that encloses the semiconductor die.

8. The method of claim 7, wherein molding the first encapsulant onto the RDL layer includes using an injection molding process.

9. The method of claim 7, wherein molding of the first encapsulant onto the RDL layer includes using a compression molding process.

10. The method of claim 7, wherein the RDL extends beyond edges of the semiconductor die.

11. The method of claim 10, wherein the number of interconnect structures are attached beyond the edges of the semiconductor die.

12. A method of forming a semiconductor device, comprising:
   forming a redistribution layer (RDL) on a carrier substrate;
   forming a first encapsulant on a first side of the RDL and on opposing sides of the RDL, wherein a second side of the RDL opposite the first side is in contact with the carrier substrate and the opposing sides are parallel to the first side and the second side;
   removing a number of portions out of the first encapsulant;
   detaching the carrier substrate, exposing the second side of the RDL;
   attaching a semiconductor die to the RDL in place of the detached carrier substrate;

forming a second encapsulant that encloses the semiconductor die and portions of the second side of the RDL facing toward but not in contact with the semiconductor die; and attaching a number of interconnect structures into each of the number of portions removed from the first encapsulant.

13. The method of claim 12, wherein removal of the number of portions out of the first encapsulant occurs subsequent to formation of the RDL and the first encapsulant and exposes portions of the first side of the RDL.

14. The method of claim 12, wherein the semiconductor die is attached to the second side of the RDL subsequent to detachment of the carrier substrate.

15. The method of claim 12, wherein formation of the second encapsulant encloses opposing sides of the semiconductor die that are parallel to a first side of the semiconductor die in contact with the RDL and a second side opposite the first side of the semiconductor die.

16. The method of claim 15, wherein the RDL is formed such that the RDL is beyond the opposing sides of the semiconductor die.

17. The method of claim 12, wherein the interconnect structures are attached to the first side of the RDL opposite the semiconductor die subsequent to formation of the second encapsulant.

18. The method of claim 12, wherein the first encapsulant is formed such that the first encapsulant encloses portions of the RDL between the interconnect structures subsequent to formation of the RDL and removal of the number of portions.

19. The method of claim 18, wherein the first encapsulant formed to enclose the portions of the RDL between the interconnect structures is formed to hold the interconnect structures in place and against the RDL.

20. The method of claim 12, wherein the interconnect structures are not covered by underfill material.

* * * * *